United States Patent [19]

Peddie et al.

[11] 4,349,879
[45] Sep. 14, 1982

[54] APPARATUS FOR CONTROLLING ELECTRICAL POWER CONSUMPTION

[75] Inventors: Robert A. Peddie, Reigate; John S. Fielden, Ottery St. Mary, both of England

[73] Assignee: South Eastern Electricity Board, England

[21] Appl. No.: 121,203

[22] Filed: Feb. 13, 1980

[30] Foreign Application Priority Data

Feb. 21, 1979 [GB] United Kingdom ............... 7906213

[51] Int. Cl.³ ............................................ G06F 15/56
[52] U.S. Cl. ................................... 364/492; 364/483; 307/35; 307/52
[58] Field of Search ................... 364/492, 483, 493; 307/35, 39, 44, 52, 62; 324/103

[56] References Cited

U.S. PATENT DOCUMENTS

| | | | |
|---|---|---|---|
| 4,041,288 | 8/1977 | Conway et al. | 364/483 |
| 4,077,061 | 2/1978 | Johnston et al. | 364/483 |
| 4,080,568 | 3/1978 | Funk | 364/483 X |
| 4,117,537 | 9/1978 | Muench | 364/492 |
| 4,130,874 | 12/1978 | Pai | 364/492 X |
| 4,168,491 | 9/1979 | Phillips et al. | 364/492 X |
| 4,213,182 | 7/1980 | Eichelberger et al. | 364/493 |

Primary Examiner—Edward J. Wise
Attorney, Agent, or Firm—Beveridge, De Grandi & Kline

[57] ABSTRACT

In an electrical power distribution system, a consumer has a control unit comprising a plurality of solid state switches in supply leads to a plurality of separate load circuits, a microprocessor responsive to the magnitude of the total current drawn by the consumer from the supply and arranged to control the various switches so as to limit the total current or power in accordance with a priority program set into the microprocessor. The consumer can thus control the manner of use of the supplied power within a maximum demand limit. This overall maximum demand limit may be predetermined in accordance with an agreed supply tariff or may be remotely controlled by the utility. Preferably two microprocessors with associated control switches are employed, one being controlled by the utility and being associated with or forming part of the energy consumption metering unit and serving to limit the maximum demand and the other being programmed by the consumer to control priority of supplies to individual load sub-circuits.

16 Claims, 1 Drawing Figure

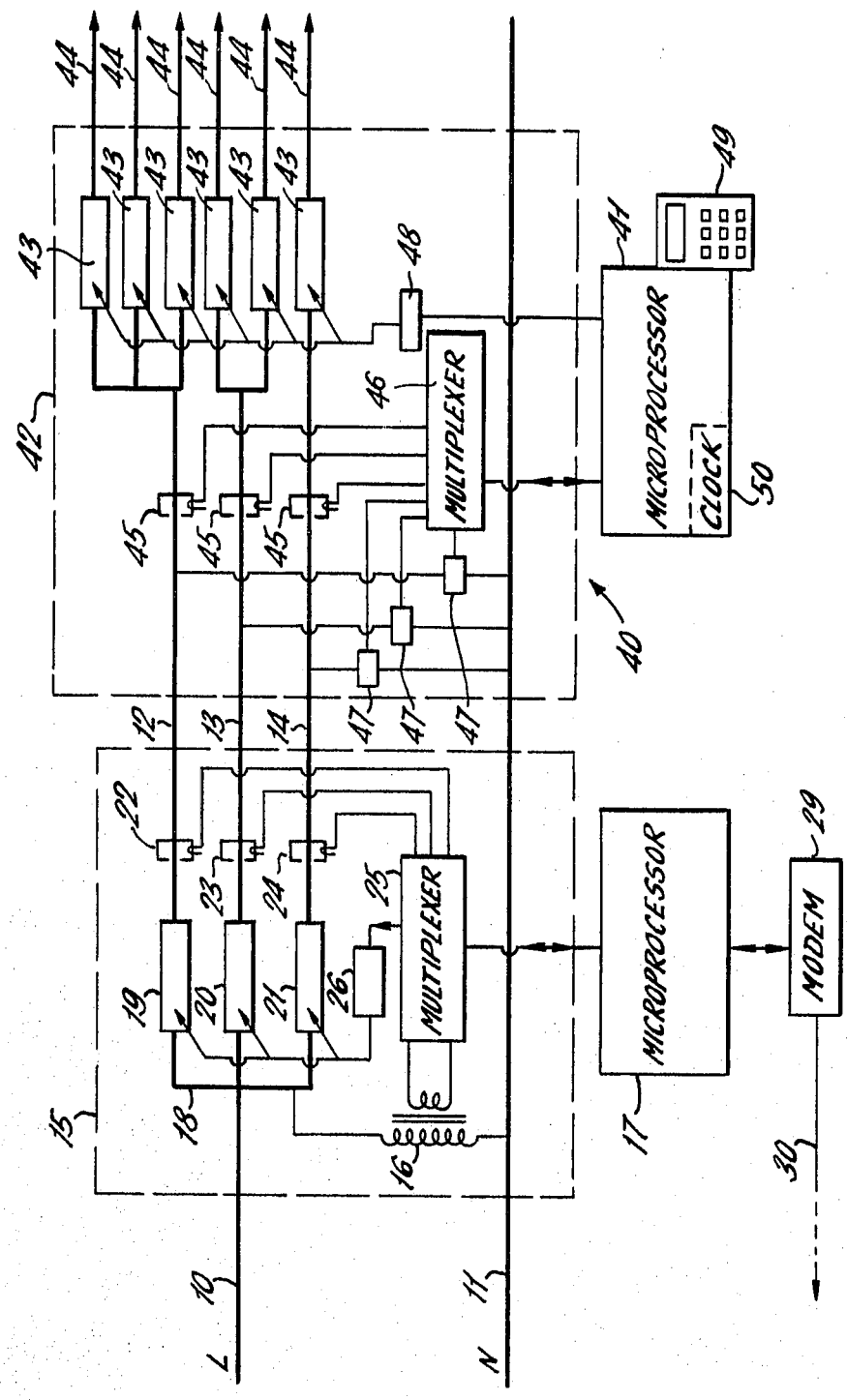

APPARATUS FOR CONTROLLING ELECTRICAL POWER CONSUMPTION

BACKGROUND OF THE INVENTION

This invention relates to load control on electrical power distribution systems.

A utility supplying electrical power commonly has to exercise load management, that is to say, to effect some control over the power demand so that it does not exceed the supply capacity. Load management is exercised in a number of ways; for example the supply tariff for a particular consumer may include provisions regarding the maximum demand for power; as another example, certain loads on a consumer's premises may be connected on a circuit which is clock-controlled so that power is available only during certain periods of the day. More particularly with large consumers of electrical power, provision may be made for interruption of the supply to particular items of plant which have a high power consumption if the utility cannot meet the demand. In extreme circumstances, however, a utility may have to limit the demand by cutting off the supply to a number of consumers. This arises because there is no means, within the control of the utility, for limiting the demand of many of the individual consumers connected to the power supply network.

It will be noted that load control is effected in the first place by the provision of incentives and/or penalties to the consumer to encourage appropriate load management control. Load control by the utility is used only when load control by the consumer is insufficient.

SUMMARY OF THE INVENTION

It is an object of the present invention to provide improved means for load control on the power consumption from an electrical distribution system.

According to this invention, apparatus for controlling electrical power consumption by a consumer drawing power from a supply network comprises current control means for controlling the current flow to a load, means for sensing the magnitude of the current supplied to the load and a controller responsive to the sensed current and arranged to set the current control means so as to limit the sensed current to a magnitude not exceeding a predetermined value. The current control means may comprise a switch or a plurality of switches controlling the currents respectively to a plurality of separate load circuits. Conveniently the switch or switches is or are solid state devices. Using a plurality of solid state switches for controlling current to separate load circuits of a consumer, the magnitude of the current may be controlled by adjusting the number of switches made conductive.

Very conveniently however, load control by the utility may be effected by providing two or more circuits from the supply network to the consumer's equipment with current control means in each circuit operated by said controller. The current control means may, in this case, each comprise a solid state switch. The controller may be programmed, for example, to limit the total current supplied in accordance with an agreed maximum demand. This maximum permissible demand may be varied automatically in accordance with the time of day or with other data, which may be contained in a data store. If, as described later, a data transmission link is provided between the utility and the controller, the control program may be changed as necessary directly by the utility.

As thus far described, the utility may have the possibility of limiting the current drawn by the consumer. In general, the consumer will prefer to determine how the current is used, if there should be some limitation on the total current. Provision may be made therefore for the consumer to control the supply to individual load circuits.

According to a preferred form of invention, apparatus for controlling electrical power consumption by a consumer drawing power from a supply network comprises a plurality of current controllers separately operable to control the supply of power to respective load circuits, means providing an output signal representative of the total current drawn by the consumer from the supply network and digital data processing means responsive to said output signal and arranged to control said current controllers so as to limit the total current in accordance with a program set into the data processing means.

The current controllers conveniently comprise solid state switches, e.g. thyristors. In the simplest form, the current to a load circuit can be switched on or off by the current controller. Using solid state switches, by monitoring the current through each switch the total current can be controlled by operation of the switches.

For providing said output signal in the case of an alternating power supply, conveniently a current transformer is employed.

The digital data processing means is conveniently a microprocessor. Such a microprocessor may be used in conjunction with a current transformer and a voltage transformer to form a kilowatt-hour meter measuring energy consumption, as described for example in the specification of co-pending application Ser. No. 110,027. of J. S. Fielden filed Jan. 7, 1980. Thus the control apparatus of the present invention may make use of a current transformer and microprocessor utilised also in a kilowatt-hour meter.

Control of current consumption can, for practical purposes, be regarded as control of power consumption but it would be possible, by feeding into the data processing means a signal representative of the voltage, to effect computation of power consumption and to utilise such a computed output to control the switches. Such a computation would be effected if the data processing means constitute part of a kilowatt-hour meter.

The current or the power can be averaged over a period of for example a few seconds to ensure that the control is not affected by transients. The averaging can be effected in the data processing means and can be over any selected period to suit the particular circumstances.

The aforementioned digital data processing means, as thus far described, effect control in accordance with a program which may be predetermined by the utility and, if a data link from the utility is available, this program may be altered as required by the utility. The same digital data processing means might also be used by the consumer to control the supply to individual loads in accordance with the consumer's priority requirements in the event of load limitation. However, it is generally desirable to keep a clear demarcation between equipment provided by the utility to meet the requirements of the utility and equipment which is controlled and used by the consumer and, for this reason, it is preferred to provide separate consumer-controllable means, which may include further switches and further digital data processing means, for use by the consumer if automatic consumer-operable control of individual load circuits is required.

By using the above-mentioned consumer-controllable means, the consumer can ensure that his total current consumption is limited in a manner which has been determined, for example, by information set into said further data processing means.

It will be noted that control of total current or power is automatic and it is effected in a manner determined by the utility. The consumer can thus operate under a maximum demand tariff without having to monitor his power consumption in order to avoid financial penalties such as are the usual practice with present-day maximum demand tariffs.

The data processing means may be arranged, after a load is disconnected, periodically to reconnect the load momentarily and to check whether or not the total current or power demand is exceeded. The load would be disconnected again or not in accordance with the result of such a check. If more than one load is disconnected, reconnections are controlled to take place in accordance with a programmed sequence.

The data processing means may constitute a clock control for sub-circuits where power is to be supplied during limited periods, e.g. during night time only.

The above-described apparatus facilitates load management by the utility in that it gives automatic control of maximum demand. The maximum demand may be energy demand (i.e. kilowatt-hours over predetermined periods) or power demand (i.e. kilowatts).

Moreover this maximum demand may be pre-programmed, e.g. clock controlled.

A further very particular advantage arises if there is a data transmission link between the data processing means on the consumer's premises and a central data processor at the utility. Such a link, making use for example of telephone lines or of carrier transmission in the power supply lines or of radio or optical fibre data transmission means may be provided if the data processing means forms part of a kilowatt-hour meter as it enables control determination of consumer's energy consumption to be effected. Such a data link may be a time-shared arrangement in which data is obtained from a store in the data processing means at the consumer's premises upon interrogation from the central data processor. With the control apparatus of the present invention, such a data link may be used to control the program in the data processing means, e.g. to reset a demand control in operation on the whole of the consumer's demand.

The use of further programmed data processing means by the consumer gives considerable flexibility to the consumer in limiting his power consumption. In the simplest case, the various load circuits may be arranged in a hierarchial order so that, in accordance with a predetermined sequence, the lowest priority circuit and then the next successive circuits in the predetermined order are switched off until the current or power is reduced to below a predetermined magnitude. However many other arrangements are possible. For example, the further data processing means may embody a clock enabling the program to be clock controlled. Clock control might alternatively be effected using clock data from a clock in the utility-controlled data processing means. This clock control permits, for example, of time sharing of loads such as heating loads; also the program may be controlled by the clock so that different programs are employed at different times. The further data processing means may have an input device, e.g. a keyboard, enabling the consumer to alter the program whilst still retaining automatic overall current or power limitation.

The further data processing means may be arranged, when demand is to be reduced, to disconnect selected sub-circuits or to put selected sub-circuits on a time-shared basis, e.g. a water heating load might be disconnected by remote control and automatically reconnected after a predetermined time, such as after a fifteen minute interval.

BRIEF DESCRIPTION OF THE DRAWING

The accompanying drawing is a block diagram illustrating diagrammatically an apparatus for the control of electrical power consumption and forming one embodiment of the invention.

DESCRIPTION OF THE PREFERRED EMBODIMENT

The apparatus shown in the drawing is for controlling power consumption of a consumer having a single phase supply. The incoming alternating supply is on leads 10, 11 of which lead 10 is the live lead and lead 11 is the neutral. The consumer has three sub-circuits shown as leads 12, 13 and 14, each sub-circuit using the common neutral lead 11 as the return path. In a unit 15, there is a voltage transformer 16 connected between leads 10, 11 to supply a low voltage output used both as a power supply and as a reference voltage for a microprocessor unit 17 which may be remote from unit 15. The current on lead 10 is fed via a bus 18 to three thyristor control circuits 19, 20, 21 which control respectively the currents in the three sub-circuits 12, 13, 14. In the simplest form each of the thyristor control circuits 19, 20, 21 may be a solid state a.c. switch.

On the output side of each control circuit 19, 20, 21, the leads 12, 13, 14 pass through current transformers 22, 23 and 24 in the unit 15. These current transformers provide signals representing the currents in the respective load circuits and these signals are fed via a multiplexer 25 to the microprocessor unit 17. A voltage signal from the voltage transformer 16 is also fed via the multiplexer 25 to the microprocessor 17. Signals from the microprocessor are fed via the multiplexer 25 and an optical isolator 26 to the thyristor control circuits 19, 20 and 21.

The microprocessor 17 may form part of a kilowatt-hour meter for determining energy consumption. For the purposes of the control system of the present invention, this microprocessor determines the currents in the various load sub-circuits and, if the total current exceeds a predetermined magnitude in a programmable store in the microprocessor, then signals are sent to the thyristor control units 19, 20, 21 in a programmed manner to reduce the total current e.g. by switching off one load or limiting permissible demand of each circuit. If this reduces the total demand below the level set in the program then the microprocessor continues, under clock control, periodically to reconnect the load or to check whether more current will be drawn without exceeding the current limitation in the load sub-circuit. The re-connection is momentary if excessive current is drawn. If the re-connection shows no excessive demand, then the switches are returned to their normal state. If necessary further sub-circuits are controlled in this way.

Although the control has been described by reference to the current, it is readily possible, utilising voltage information from a voltage transformer (which might be part of a kilowatt-hour meter for determining energy consumption) to effect the control in terms of energy demand i.e. kilowatts. The microprocessor may include averaging means to average the current or power demand over a short period to avoid operation on transients. Integration of power demand over a period gives the total energy described over that period and control may be effected in accordance with the maximum energy demand during each successive predetermined period.

The microprocessor 17 is connected by a modem 29 or other isolator unit to a data link 30 leading to a central processor at the utility. This data link may make use of telephone lines or a data transmission system using carriers on the power lines. Other forms of data transmission links may be used, e.g. a radio link or optical fibres. Normally a time-sharing system would be employed for such transmission links to a number of consumers. The central processor would interrogate one particular microprocessor 17 when information is required from that microprocessor or when instructions are to be transferred thereto.

As previously explained, the utility may have the power to change or modify the program in the microprocessor, particularly in abnormal system conditions. In this way the energy demand from the particular user can be controlled, if necessary differentiating between different load circuits. The data link 30 may also be used for resetting a clock in the microprocessor 17 so that this represents real clock time even in the event of any interruptions of power to the microprocessor.

In the apparatus as thus far described, the total current demand or power demand or energy demand is limited. A consumer operating, for example on a maximum demand tariff can utilise this control of the load sub-circuits 12, 13, 14 directly as a control to switch off certain loads if the maximum demand is being exceeded. Such a consumer thus can operate under a maximum demand tariff without having to monitor its demand and effect manual switching operations.

Some consumers however will prefer to have control of the switching off of loads so that they can determine and can change the priority of disconnection. For this purpose there is provided a further control unit 40, including a microprocessor 41 for data processing and also a consumer's switching unit 42 containing solid state switches 43 which, in this case, may be arranged for individual switching of individual load circuits 44. These switches are controlled by the microprocessor 41 via an isolator 48. The control unit 40 and switching unit 42 would, in general, be the property of and under the control of the consumer; in order to provide a clear demarcation between the consumer's equipment and that belonging to the utility (such as units 15, 17 and 29), it is preferred to provide the consumer's unit with its own current transformers 45 and multiplexer 46 for feeding current data to the microprocessor 41. The unit 42 also contains voltage transformers 47 to provide signals to the microprocessor 41 indicating if the supply on any of the leads 12, 13, 14 has been interrupted. Associated with the microprocessor 41 is a keypad 49 enabling the program stored therein to be changed as required.

If, at the unit 15, the maximum permitted demand is exceeded, one or more of the thyristor switches 19, 20 or 21 in unit 15 will be opened so interrupting the current in one or more of the sub-circuit leads 12, 13, 14. The total current received by the consumer will thus be reduced to be within the permitted maximum. Such interruption of current on one of the leads will be sensed by the appropriate voltage transformer 47 and this information fed to the microprocessor 41. The consumer can program this microprocessor in accordance with any required priority for load disconnection in the event of maximum demand being exceeded. The microprocessor 41 is set to start cutting off loads when the total sensed by current transformers 45 is just below the maximum at which microprocessor 17 operates switches 19. Thus the consumer's control unit 40 will normally operate to control the total load within the permitted limit and in accordance with the consumer's priority requirements. If, however, one of the switches 19 has been opened, the microprocessor 41 receives data by the absence of a signal from the appropriate voltage transformer 47. If there is a load connected to the interrupted supply and which has a priority higher than a load still being supplied, then the microprocessor 41 has to start to reduce the load by operation of one or more switches 43. If the reduction of load by operation of the switch or switches 43 is adequate, this will be detected by microprocessor 17 at the next momentary restoration of the supply interrupted by one of the thyristor switches 19, 20 or 21. The supply is thus restored to all three leads 12, 13 and 14. The consumer's microprocessor 41 then has control of and responsibility for maintaining the total current within the permitted limit, this control being effected by switches 43 in accordance with the priority requirements stored in microprocessor 41. It will be seen that, although the microprocessor 17 with its associated control unit 15 serves to ensure that the maximum demand does not exceed some predetermined level, the consumer has full control as to how the power is to be utilised provided the demand is kept within the permitted limit. Thus it is not essential to have three circuits 12, 13, 14 between the utility's control unit 15 and the consumer's unit 42. By providing more than one circuit however between these two units, the switching requirements are considerably reduced; the consumer will, in general, always have some power available without even momentary interruptions. If the consumer does not have a separate control unit 40 with its switching unit 42, then the provision of a plurality of load sub-circuits such as 12, 13 and 14 is necessary to permit of the demand being controlled without complete interruption of the supply to a consumer.

The consumer's microprocessor 41 may include a clock 50 for clock control of a stored program and/or for controlling time-sharing of the supply between separate loads. If any load is disconnected by one of the switches 43, the microprocessor is arranged periodically to close momentarily that switch relating to the load which is next on the priority list to be restored. If the total current then drawn does not exceed the permissible limit, the supply is restored to this load. If the total current drawn on momentary closure of the switch 43 exceeds the permissible limit, one of the switches 19 may be opened. The overall system will operate automatically, in this case, in the manner previously described so as to restore control to the consumer's microprocessor 41. The consumer however will, in general, know the likely current to be drawn by each load and his microprocessor 41 can be programmed to take this information into account before making any momentary closure of a switch 43. The consumer can also control the time interval between any such momentary closures of switches 43 and this time interval may be considerably greater than that between the checks made by the utility's microprocessor 17.

We claim:

1. Apparatus for controlling electrical power consumption by a load of a consumer drawing power from a power supply network, said apparatus comprising current control means for controlling the flow of current to the load from the power supply network, means for sensing the magnitude of the current supplied to the load from the power supply network, a controller responsive to the sensed current and arranged to set the current limit means so as to limit the sensed current to a magnitude not exceeding a predetermined value, and means for remotely applying to the controller information defining the predetermined value.

2. Apparatus as claimed in claim 1 wherein the current control means comprise a switch.

3. Apparatus as claimed in claim 1 wherein the current control means comprise a plurality of switches controlling the currents respectively to a plurality of separate load sub-circuits.

4. Apparatus as claimed in claim 3 wherein the switches are solid state devices.

5. Apparatus as claimed in claim 3 wherein the controller comprises digital data processing means arranged to operate the switches to disconnect selected sub-circuits in accordance with a predetermined program when the sensed current exceeds the predetermined value, and means for automatically reconnecting disconnected sub-circuits after a predetermined time interval.

6. Apparatus as claimed in claim 1 wherein the controller comprises digital data processing means.

7. Apparatus for controlling electrical power consumption by a plurality of load circuits of a consumer drawing power from a power supply network, said apparatus comprising a plurality of current controllers separately operable to control the supply of power to the respective load circuits, means providing an output signal representative of the total current drawn by the load circuits of the consumer from the power supply network, digital data processing means responsive to the output signal and arranged to control said current controllers so as to limit the total current or power drawn by the load circuits in accordance with a program set into the digital data processing means, and means for remotely applying to the digital data processing means information defining the predetermined value.

8. Apparatus for controlling electrical power consumption by a plurality of load circuits of a consumer drawing power from a supply network, said apparatus comprising a first control unit including a plurality of current controllers separately operable to control the supply of power from the supply network to respective sub-circuits of the consumer, means providing an output signal representative of the total current or power drawn by the consumer from the supply network, a first remotely addressable digital data processing means responsive to the output signal and arranged to control said current controllers so as to limit the total current or power drawn by the consumer in accordance with a program set into the first data processing means, a second control unit including a plurality of further current controllers separately operable to control the supply of power from said sub-circuits to the respective load circuits, and a second digital data processing means responsive to the total current drawn by the load circuits and arranged to control said further current controllers in accordance with a priority program set into the second digital data processing means so as to limit the total current or power drawn by the consumer from the supply.

9. Apparatus as claimed in claim 8 wherein said second digital data processing means includes input means for putting data or program information into the second digital data processing means.

10. Apparatus as claimed in claim 8 wherein means producing signals representative of the currents in said sub-circuits are provided for controlling said second digital data processing means.

11. Apparatus as claimed in claim 8 wherein means producing signals representative of the voltages in the sub-circuits are provided for controlling said second digital data processing means.

12. Apparatus as claimed in claim 8 wherein each current controller is a solid state switching device and wherein said second digital data processing means is arranged to disconnect selected load circuits in accordance with a predetermined program, said apparatus further comprising means for automatically reconnecting disconnected load circuits after a predetermined time interval.

13. Apparatus as claimed in claim 8 wherein the means providing an output signal representative of the total current comprises at least one current transformer.

14. Apparatus as claimed in claim 13 wherein separate current transformers are provided on a plurality of load sub-circuits.

15. Apparatus as claimed in claim 8 and wherein each said data processing means is arranged to average the measured current over a predetermined period.

16. Apparatus as claimed in claim 8 and having input means comprising a data link from a remote location for adjusting the information in said first digital data processing means.

* * * * *